(12) United States Patent
Abraham et al.

(10) Patent No.: US 11,908,756 B2
(45) Date of Patent: Feb. 20, 2024

(54) INTERPOSER CHIPS AND ENCLOSURES FOR QUANTUM CIRCUITS

(71) Applicant: International Business Machines Corporation, Armonk, NY (US)

(72) Inventors: David Abraham, Croton, NY (US); John Michael Cotte, New Fairfield, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 195 days.

(21) Appl. No.: 17/644,695

(22) Filed: Dec. 16, 2021

(65) Prior Publication Data
US 2023/0197539 A1    Jun. 22, 2023

(51) Int. Cl.
| | |
|---|---|
| H01L 23/049 | (2006.01) |
| H01L 23/498 | (2006.01) |
| H01L 23/16 | (2006.01) |
| H01L 23/13 | (2006.01) |
| H01L 23/06 | (2006.01) |
| H01L 23/552 | (2006.01) |
| H01L 21/52 | (2006.01) |

(52) U.S. Cl.
CPC ........... *H01L 23/049* (2013.01); *H01L 21/52* (2013.01); *H01L 23/06* (2013.01); *H01L 23/13* (2013.01); *H01L 23/16* (2013.01); *H01L 23/49888* (2013.01); *H01L 23/552* (2013.01)

(58) Field of Classification Search
CPC ....... H01L 23/049; H01L 23/06; H01L 23/13; H01L 23/16; H01L 23/49888; H01L 23/552; H01L 21/52
See application file for complete search history.

(56) References Cited

U.S. PATENT DOCUMENTS

| | | | |
|---|---|---|---|
| 8,519,543 B1 | 8/2013 | Song et al. | |
| 9,224,647 B2 | 12/2015 | Koo et al. | |
| 9,269,659 B1 | 2/2016 | Foong et al. | |
| 9,836,699 B1 | 12/2017 | Rigetti et al. | |
| 10,134,972 B2 | 11/2018 | Oliver et al. | |
| 11,536,897 B1* | 12/2022 | Thompson | G02B 6/4243 |
| 2006/0186906 A1* | 8/2006 | Bottoms | G01R 1/07378 |
| | | | 324/755.05 |

(Continued)

FOREIGN PATENT DOCUMENTS

WO    2020099171 A1    5/2020

OTHER PUBLICATIONS

Mallek, et al., "Fabrication of superconducting through-silicon vias," arXiv:2103.08536v1 [quant-ph] Mar. 15, 2021, 14 pages.

(Continued)

*Primary Examiner* — Peniel M Gumedzoe
(74) *Attorney, Agent, or Firm* — Amin, Turocy & Watson, LLP (57) ABSTRACT

Techniques regarding qubit chip assemblies are provided. For example, one or more embodiments described herein can include an apparatus that can comprise a qubit chip positioned on an interposer chip. The apparatus can also comprise an electrical connector in direct contact with the interposer chip. The electrical connector can establish an electrical communication between a wire and a contact pad of the interposer chip that is coupled to the qubit chip.

20 Claims, 10 Drawing Sheets

(56) References Cited

U.S. PATENT DOCUMENTS

| | | | | |
|---|---|---|---|---|
| 2008/0006930 A1* | 1/2008 | Ichida | ............ | H01L 24/49 |
| | | | | 257/E23.079 |
| 2008/0128889 A1* | 6/2008 | Jeong | ............ | H01L 23/36 |
| | | | | 257/E23.101 |
| 2009/0173936 A1* | 7/2009 | Bunyk | ............ | B82Y 10/00 |
| | | | | 257/31 |
| 2021/0305165 A1* | 9/2021 | Shao | ............ | H01L 24/13 |

OTHER PUBLICATIONS

Peruzzo, et al., "A variational eigenvalue solver on a photonic quantum processor," Nature Communications | 5:4213 | DOI: 10.1038/ncomms5213, Published Jul. 23, 2014, 7 pages.

Kandala, et al., "Error mitigation extends the computational reach of a noisy quantum processor," Mar. 28, 2019 | vol. 567 | Nature | 491, https://doi.org/10.1038/s41586-019-1040-7, 11 pages.

Hammamura, et al., "Efficient evaluation of quantum observables using entangled measurements," npj Quantum Information (2020) 6:56 ; https://doi.org/10.1038/s41534-020-0284-2, 8 pages.

Van den Berg, et al., "Circuit optimization of Hamiltonian simulation by simultaneous diagonalization of Pauli clusters," arXiv:2003.13599v2 [quant-ph] Sep. 5, 2020, Accepted in Quantum Aug. 31, 2020, 28 pages.

\* cited by examiner

```
┌─────────────────────────────────────────────────┐
│ POSITIONING A QUBIT CHIP ASSEMBLY WITHIN A QUBIT │
│ CHIP ENCLOSURE SUCH THAT THE QUBIT CHIP ASSEMBLY │──1002
│ IS POSITIONED BETWEEN SIDE WALLS OF THE QUBIT    │
│ CHIP ENCLOSURE                                   │
└─────────────────────────────────────────────────┘
                         │
                         ▼
┌─────────────────────────────────────────────────┐
│ POSITIONING A QUBIT CHIP ENCLOSURE LID ONTO THE  │
│ QUBIT CHIP ENCLOSURE SUCH THAT AN ELECTRICAL     │
│ CONNECTOR IS ALIGNED WITH A CONTACT PAD ON AN    │──1004
│ INTERPOSER CHIP OF THE QUBIT CHIP ASSEMBLY,      │
│ WHEREIN THE ELECTRICAL CONNECTOR CAN EXTEND      │
│ THROUGH THE QUBIT CHIP ENCLOSURE LID             │
└─────────────────────────────────────────────────┘
                         │
                         ▼
┌─────────────────────────────────────────────────┐
│ DIRECTLY COUPLING THE INTERPOSER CHIP TO THE     │──1006
│ ELECTRICAL CONNECTOR                             │
└─────────────────────────────────────────────────┘
                         │
                         ▼
┌─────────────────────────────────────────────────┐
│ PRESSING THE QUBIT CHIP ASSEMBLY TOWARDS THE     │
│ QUBIT CHIP ENCLOSURE VIA A PRESSING DEVICE,      │
│ WHERE THE QUBIT CHIP ENCLOSURE LID COMPRISES THE │──1008
│ PRESSING DEVICE ON A SIDE OF THE QUBIT CHIP      │
│ ENCLOSURE LID THAT FACES THE QUBIT CHIP ASSEMBLY │
└─────────────────────────────────────────────────┘
                         │
                         ▼
┌─────────────────────────────────────────────────┐
│ SHIELDING A QUBIT CHIP OF THE QUBIT CHIP         │
│ ASSEMBLY FROM ELECTROMAGNETIC INTERFERENCE VIA   │──1010
│ AN ISOLATION BARRIER EXTENDING FROM THE QUBIT    │
│ CHIP ENCLOSURE LID                               │
└─────────────────────────────────────────────────┘
```

INTERPOSER CHIPS AND ENCLOSURES FOR QUANTUM CIRCUITS

BACKGROUND

The subject disclosure relates to qubit chip assemblies comprising an interposer chip directly coupled to one or more electrical connectors, and more specifically, to qubit chip assembly structures and/or qubit chip enclosures that can facilitate a direct coupling between one or more electrical connectors and an interposer chip.

Typical qubit chip assemblies comprise a qubit chip bonded to an interposer chip, which is in turn bonded to a printed circuit board ("PCB"). The PCB is then coupled to one or more electrical connectors to facilitate wiring the quantum chip assembly into a quantum circuit. The typical qubit chip assembly requires two separate bonding operations: a first bonding between the qubit chip and the interposer chip; and a second bonding between the interposer chip and the PCB.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatuses, devices, and/or methods regarding one or more interposer chips and/or enclosure architectures for a quantum circuit are described.

According to an embodiment, an apparatus is provided. The apparatus can comprise a qubit chip positioned on an interposer chip. The apparatus can also comprise an electrical connector in direct contact with the interposer chip. The electrical connector can establish an electrical communication between a wire and a contact pad of the interposer chip that is coupled to the qubit chip. An advantage of such an apparatus can be the direct electrical coupling of the interposer chip without necessitating a PCB.

In some examples, the interposer chip can comprise a superconducting transmission line coupling the qubit chip to the contact pad. An advantage of such an apparatus can be the use of superconducting materials to direct couple the qubit chip to the one or more electrical connectors.

According to another embodiment, an apparatus is provided. The apparatus can comprise a qubit chip enclosure lid. Further, the apparatus can comprise an electrical connector that extends through the qubit chip enclosure lid. The electrical connector can have a pressure connection portion and a wire connection portion positioned at opposite ends of the electrical connector. An advantage of such an apparatus can be the enabled housing of a qubit chip assembly while facilitating a direct electrical connection to an interposer chip of the qubit chip assembly.

In some examples, the pressure connection portion can be at a first side of the qubit chip enclosure lid, and the wire connection portion can be at a second side of the qubit chip enclosure lid. Further, the qubit chip enclosure lid can further comprise a pressing device positioned on the first side of the qubit chip enclosure lid. An advantage of such an apparatus can be the application of pressure to an interposer chip covered by the qubit chip enclosure lid to secure a position of the interposer chip within a qubit chip enclosure.

According to an embodiment, a method is provided. The method can comprise directly coupling an interposer chip of a qubit chip assembly to an electrical connector. The electrical connector can extend through a qubit chip enclosure lid. Also, the interposer chip can be further coupled to a qubit chip. An advantage of such a method can be the establishment of a direct coupling between the interposer chip and electrical connection to avoid necessitation of a PCB, and thereby reduce the possibility of a bonding failure between components of the qubit chip assembly.

In some examples, the method can further comprise shielding a qubit chip of the qubit chip assembly from electromagnetic interference via an isolation barrier that extends from the qubit chip enclosure lid. An advantage of such a method can be shielding the qubit chip by covering the qubit chip with the qubit chip enclosure lid.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section. Additionally, features depicted in the drawings with like shading, cross-hatching, and/or coloring can comprise shared compositions and/or materials.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As the number of bonding operations for a qubit chip assembly increases, the quantum circuit can be more prone to failure. Further, thermal expansion coefficients of the interposer chip and the PCB can differ, resulting in mechanical failures in the bonds joining the interposer chip and PCB. Moreover, PCBs can comprise non-superconducting components that can cause losses in signal transmission in the quantum circuit. Given the problems with other implementations of quantum circuits; the present disclosure can be implemented to produce a solution to one or more of these problems via an interposer chip that can directly couple to a wiring circuitry. Advantageously, one or more embodiments described herein can operatively couple one or more electrical connectors directly to the interposer chip of a qubit chip assembly. The electrical connectors can establish an electrical communication between one or more wires and the interposer chip. Further, the various qubit chip assemblies described herein can enable a superconducting connection between the electrical connectors and a qubit chip. Moreover, one or more qubit chip assemblies described herein can reduce the number of bonding operations between materials having markedly different thermal expansion coefficients.

Various embodiments described herein can include a qubit chip assembly comprising one or more qubit chips positioned on an interposer chip, where the interposer chip can couple directly to a wiring circuitry via one or more electrical connectors. For example, the interposer chip can comprise one or more contact pads that can couple to the one or more electrical connectors via a removable connection, such as a pressure connection. Additionally, the contact pads can be coupled to one or more qubit chips via one or more superconducting transmission lines positioned on, or embedded within, the interposer chip.

Moreover, various embodiments described herein can include one or more enclosures for housing the qubit chip assembly, where the one or more enclosures can comprise an enclosure lid that can enable the one or more electrical connectors to traverse through the enclosure lid and couple to the qubit chip assembly. For example, the one or more enclosures can also comprise an enclosure base that can support the qubit chip assembly, where closing the enclosure lid onto the enclosure base can seal the qubit chip assembly within the enclosure. Moreover, the enclosure can include one or more isolation barriers that can shield the qubit chip from electromagnetic coupling between the qubit chip and surrounding portions of the interposer chip.

As described herein, the terms "deposition process" and/or "deposition processes" can refer to any process that grows, coats, deposits, and/or otherwise transfers one or more first materials onto one or more second materials. Example deposition processes can include, but are not limited to: physical vapor deposition ("PVD"), chemical vaper deposition ("CVD"), electrochemical deposition ("ECD"), atomic layer deposition ("ALD"), low-pressure chemical vapor deposition ("LPCVD"), plasma enhanced chemical vapor deposition ("PECVD"), high density plasma chemical vapor deposition ("HDPCVD"), sub-atmospheric chemical vapor deposition ("SACVD"), rapid thermal chemical vapor deposition ("RTCVD"), in-situ radical assisted deposition, high temperature oxide deposition ("HTO"), low temperature oxide deposition ("LTO"), limited reaction processing CVD ("LRPCVD"), ultrahigh vacuum chemical vapor deposition ("UHVCVD"), metalorganic chemical vapor deposition ("MOCVD"), physical vapor deposition ("PVD"), chemical oxidation, sputtering, plating, evaporation, spin-on-coating, ion beam deposition, electron beam deposition, laser assisted deposition, chemical solution deposition, a combination thereof, and/or the like.

As described herein, the terms "etching process", "etching process", "removal process", and/or "removal processes" can refer to any process that removes one or more first materials from one or more second materials. Example etching and/or removal processes can include, but are not limited to: wet etching, dry etching (e.g., reactive ion etching ("RIE")), chemical-mechanical planarization ("CMP"), a combination thereof, and/or the like.

As described herein, the terms "lithography process" and/or "lithography processes" can refer to the formation of three-dimensional relief images or patterns on a semiconductor substrate for subsequent transfer of the pattern to the substrate. In semiconductor lithography, the patterns can be formed by a light sensitive polymer called a photo-resist. To build the complex structures that make up a semiconductor device and the many wires that connect the various features of a circuit, lithography processes and/or etch pattern transfer steps can be repeated multiple times. Each pattern being printed on the wafer can be aligned to the previously formed patterns and slowly the subject features (e.g., conductors, insulators and/or selectively doped regions) can be built up to form the final device.

As described herein the term "superconducting" can characterize a material that exhibits superconducting properties at or below a superconducting critical temperature, such as aluminum (e.g., superconducting critical temperature of 1.2 Kelvin) or niobium (e.g., superconducting critical temperature of 9.3 Kelvin). Additionally, one of ordinary skill in the art will recognize that other superconductor materials (e.g., hydride superconductors, such as lithium/magnesium hydride alloys) can be used in the various embodiments described herein.

Figure 1:
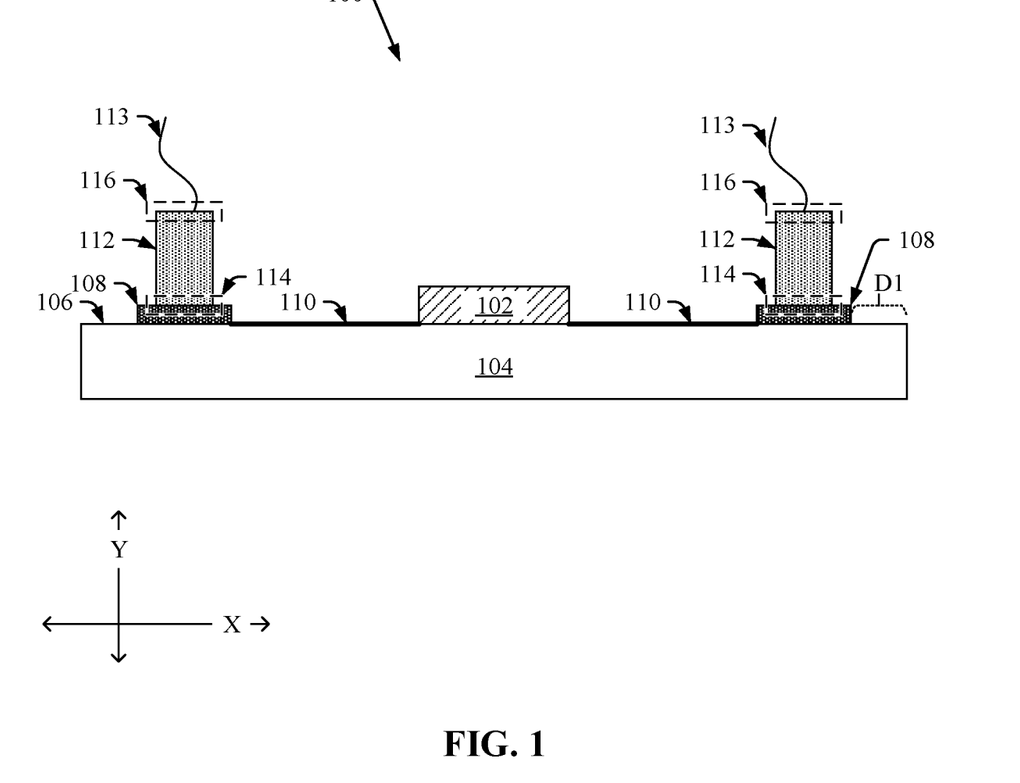
FIG. 1 illustrates diagram of an example, non-limiting qubit chip assembly that can comprise an interposer chip directly coupled to one or more electrical connectors in accordance with one or more embodiments described herein.

FIG. 1 illustrates a diagram of an example, non-limiting qubit chip assembly 100 that can comprise one or more qubit chips 102 positioned on an interposer chip 104 in accordance with one or more embodiments described herein. Repetitive description of like elements employed in other embodiments described herein is omitted for the sake of brevity. As shown in FIG. 1, the one or more qubit chips 102 can be positioned on a first surface 106 of the interposer chip 104.

In various embodiments, the one or more qubit chips 102 can comprise one or more superconducting qubits. For example, superconducting qubits (e.g., such as superconducting quantum interference devices "SQUIDs") can be lithographically defined electronic circuits that can be cooled to milli-Kelvin temperatures to exhibit quantized energy levels (e.g., due to quantized states of electronic charge or magnetic flux). Superconducting qubits can be Josephson junction-based, such as transmon qubits and/or the like. Also, superconducting qubits can be compatible with microwave control electronics, and can be utilized with gate-based technology or integrated cryogenic controls.

In one or more embodiments, the one or more qubit chips 102 can be bonded to the interposer chip 104. For instance, the one or more qubit chips 102 can be bump bonded to the interposer chip 104 via one or more solder bumps. Example bonding operations that can facilitate fixing the one or more qubit chips 102 to the interposer chip 104 can include, but are not limited to: bump bonding, wire bonding, a combination thereof, and/or the like.

In one or more embodiments, the interposer chip 104 can support the one or more qubit chips 102 and/or facilitate one or more electrical connections. The interposer chip 104 can comprise essentially (e.g., except for contaminants) a single element (e.g., silicon or germanium) and/or a compound, such as silicon germanium. Additionally, the interposer chip 104 can comprise multiple layers. In one or more embodiments, the interposer chip 104 can be a silicon wafer. In various embodiments, the interposer chip 104 can comprise a single crystal silicon (Si), silicon germanium (e.g., characterized by the chemical formula SiGe), a Group III-V semiconductor wafer or surface/active layer, a combination thereof, and/or the like. The dimensions of the interposer chip 104 can vary depending on the number and/or architecture of the one or more qubit chips 102 and/or the application of the qubit chip assembly 100. For instance, the length (e.g., along the "X" axis shown in FIG. 1) of the interposer chip 104 can range from, for example, greater than or equal to 10 millimeters (mm) and less than or equal to 300 mm. Also, the thickness (e.g., along the "Y" axis shown in FIG. 1) of the interposer chip 104 can range from, for example, greater than or equal to 50 micrometers (μm) and less than or equal to 21 mm. In one or more embodiments, the interposer chip 104 can have a circular shape.

In various embodiments, the one or more qubit chips 102 and the interposer chip 104 can have similar thermal expansion coefficients. For example, a thermal expansion coefficient of the one or more qubit chips 102 can be greater than or equal to 1 parts per million per degree Centigrade (ppm/° C.) and less than or equal to 10 ppm/° C. Also, a thermal expansion coefficient of the interposer chip 104 can be greater than or equal to 1 ppm/° C. and less than or equal to 10 ppm/° C. For instance, a difference between the thermal expansion coefficients of the interposer chip 104 and the qubit chip 102 can be less than or equal to, for example, 5 ppm/° C.

In one or more embodiments, the interposer chip 104 can comprise one or more contact pads 108 positioned on the first surface 106. The one or more contact pads 108 can comprise a superconducting material, including, but not limited to: niobium, aluminum, titanium, tungsten, molybdenum, nitrides of the same, a combination thereof, and/or the like. In one or more embodiments, the one or more contact pads 108 can be positioned on the same side of the interposer chip 104 as the one or more qubit chips 102 (e.g., as shown in FIG. 1). In one or more embodiments, the one or more contact pads 108 and the one or more qubit chips 102 can be positioned on opposite sides of the interposer chip 104. Additionally, the one or more contact pads 108 can be positioned a distance D1 from the perimeter of the interposer chip 104. In one or more embodiments, the distance D1 can vary based on the dimensions of the interposer chip 104. For example, the distance D1 can be greater than or equal to 1 mm and less than or equal to 2 centimeters (cm).

Figure 2:
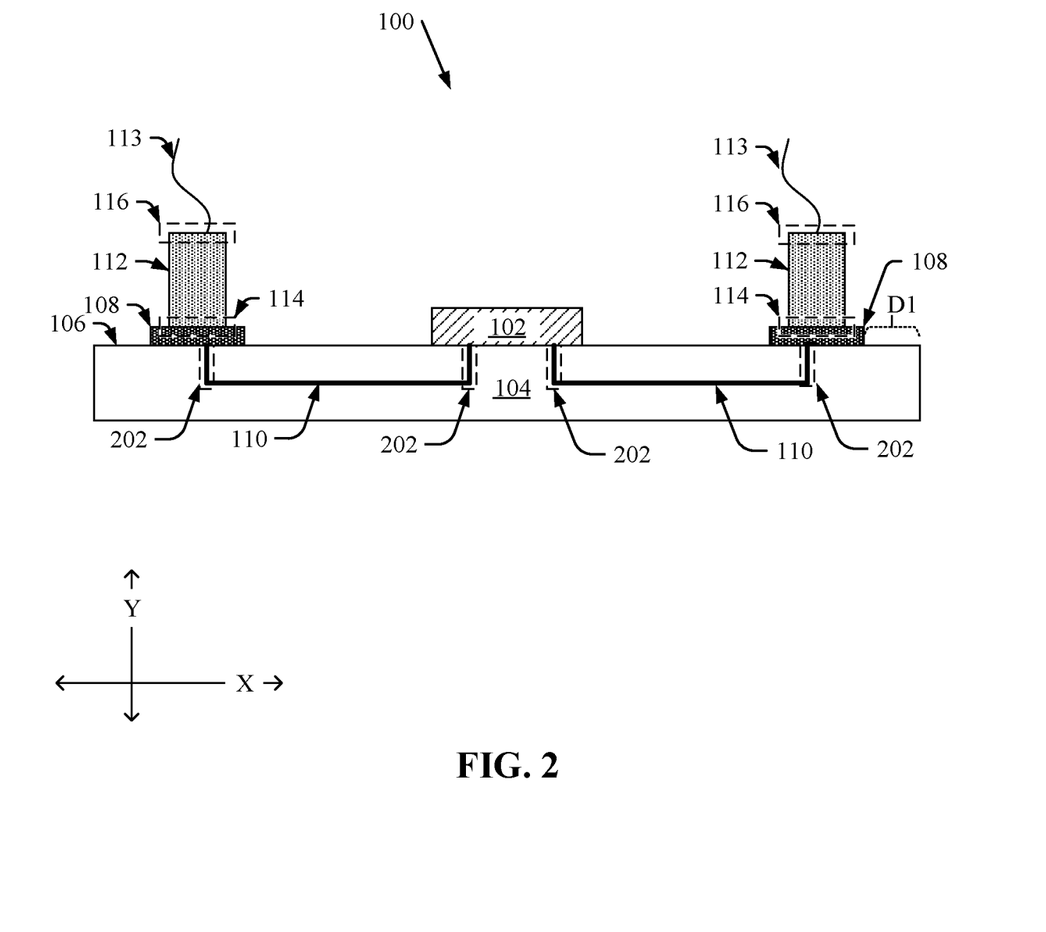
FIG. 2 illustrates a diagram of an example, non-limiting qubit chip assembly that can comprise an interposer chip that can directly couple one or more qubit chips to one or more electrical connectors via an embedded circuitry in accordance with one or more embodiments described herein.

As shown in FIG. 1, the one or more contact pads 108 can be operatively coupled to the one or more qubit chips 102 via one or more transmission lines 110 (e.g., represented via bold lines in FIG. 1). The one or more transmission lines 110 can comprise a superconducting material, including, but not limited to: niobium, aluminum, niobium nitride, titanium nitride, molybdenum, lead, tin, a combination thereof, and/or the like. In various embodiments, the one or more transmission lines 110 can be positioned on a surface (e.g., first surface 106) of the interposer chip 104 (e.g., as shown in FIG. 1). For instance, the one or more transmission lines 110 can be formed onto the interposer chip 104 via one or more lithography processes. In one or more embodiments, the one or more transmission lines 110 can extend within the interposer chip 104 (e.g., as shown in FIG. 2). For instance, the one or more transmission lines 110 can be positioned between one or more layers of the interposer chip 104 and/or within one or more through-silicon vias ("TSV") by one or more etching and/or deposition processes. The one or more transmission lines 110 can extend from the one or more qubit chips 102 to the one or more contact pads 108. Further, the one or more transmission lines 110 can electrically couple the one or more qubit chips 102 to the one or more contact pads 108.

In various embodiments, the one or more contact pads 108 can mate with one or more electrical connectors 112; thereby the interposer chip 104 can be directly coupled to the one or more electrical connectors 112 (e.g., as show in FIG. 1). For instance, the interposer chip 104 can be directly coupled (e.g., removably coupled) to the one or more electrical connectors 112 via a solderless pressure connection. In one or more embodiments, the one or more electrical connectors 112 can establish an electrical communication between one or more wires 113 and the one or more contact pads 108. For instance, the one or more electrical connectors 112 can be microwave connectors. For example, the one or more electrical connectors 112 can comprise a pressure connection portion 114 that can establish an electrical connection with a corresponding contact pad 108 when pressed against the contact pad 108. For instance, the one or more electrical connectors 112 can be pressed against respective contact pads 108 via gravity and/or an exerted force. For instance, in one or more embodiments, the one or more electrical connectors 112 can be fixed to the interposer chip 104 via a fixing means (e.g., a clamp, screw, latch, and/or the like), where the fixing means can exert a force to press the electrical connector 112 to the contact pad 108. In another instance, the one or more electrical connectors 112 can be push-on connectors. Further, the one or more electrical connectors 112 can comprise a wire connection portion 116 that can couple to one or more wires 113. As shown in FIG. 1, the pressure connection portion 114 and the wire connection portion 116 can be at opposite ends of the electrical connectors 112. In various embodiments, the one or more qubit chips 102 can be controlled, modified, measured, and/or otherwise operated via one or more electrical signals sourced from the one or more wires 113. For instance, one or more electrical signals can propagate from the one or more wires 113, through the electrical connectors 112 to the contact pads 108, through the contact pads 108 to the transmission lines 110, and/or through the transmission lines 110 to the one or more qubit chips 102.

FIG. 2 illustrates a diagram of the example, non-limiting qubit chip assembly 100 comprising embedded transmission lines 110 in accordance with one or more embodiments described herein. Repetitive description of like elements employed in other embodiments described herein is omitted for the sake of brevity. As shown in FIG. 2, in one or more embodiments the one or more transmission lines 110 can be embedded within the interposer chip 104. For example, the one or more transmission lines 110 can extend from the one or more contact pads 108 into the interposer chip 104 through one or more TSVs 202. Likewise, the one or more transmission lines 110 can extend through the interposer chip 104 to the one or more qubit chips 102 through one or more TSVs 202. By positioning the one or more transmission lines 110 within the interposer chip 104, more space can be made available on the first surface 106 of the interposer chip 104 (e.g., to facilitate additional qubit chips 102).

Figure 3:
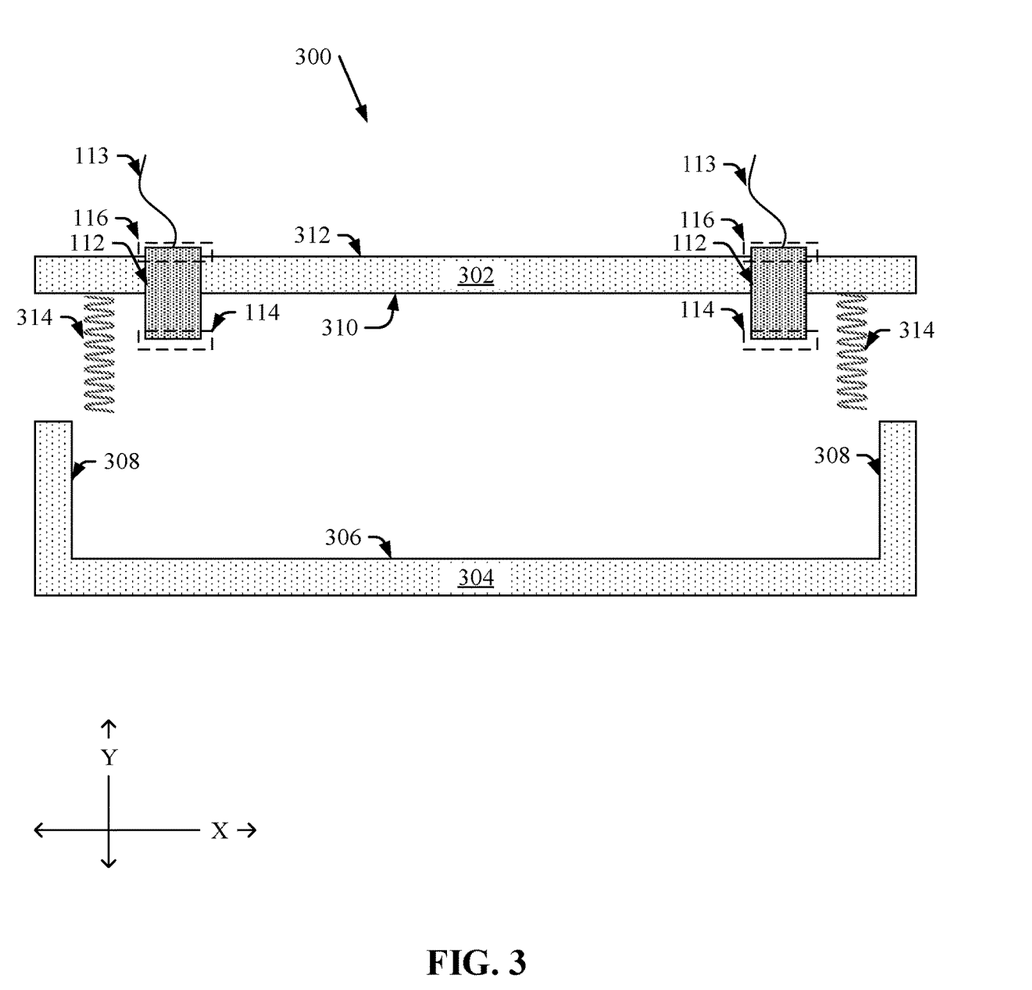
FIG. 3 illustrates a diagram of an example, non-limiting enclosure that can house one or more qubit chip assemblies in accordance with one or more embodiments described herein.

FIG. 3 illustrates a diagram of an example, non-limiting qubit chip enclosure 300 that can house the one or more qubit chip assemblies 100 in accordance with one or more embodiments described herein. Repetitive description of like elements employed in other embodiments described herein is omitted for the sake of brevity. As show in FIG. 3, the qubit chip enclosure 300 can comprise a lid 302 and/or a base 304.

The base 304 can comprise a bottom wall 306 and a plurality of side walls 308. For example, the plurality of side walls 308 can extend from the bottom wall 306. In various embodiments, the base 304 can comprise a rigid material that can be thermally conductive. Example materials that can be comprised within the base 304 include, but are not limited to: tungsten, copper, sapphire, quartz, boron nitride, a combination thereof, and/or the like. In one or more embodiments, the base 304 can support the qubit chip assembly 100. For example, the qubit chip assembly 100 can rest on the bottom wall 306 and between the plurality of side walls 308. A thickness (e.g., along the "Y" axis shown in FIG. 3) of the bottom wall 306 can vary depending on the dimensions of the qubit chip enclosure 300 and/or qubit chip assembly 100. For instance, a thickness (e.g., along the "Y" axis shown in FIG. 3) of the bottom wall 306 can range from, for example, greater than or equal to 1 mm and less than or equal to 2 cm. Also, a thickness (e.g., along the "X" axis shown in FIG. 3) of the plurality of side walls 308 can vary depending on the dimensions of the qubit chip enclosure 300 and/or qubit chip assembly 100. For instance, a thickness (e.g., along the "X" axis shown in FIG. 3) of the plurality of side walls 308 can range from, for example, greater than or equal to 1 mm and less than or equal to 2 cm.

The lid 302 can also comprise a rigid material that can be thermally conductive. Example materials that can be comprised within the lid 302 include, but are not limited to: tungsten, copper, sapphire, quartz, boron nitride a combination thereof, and/or the like. In one or more embodiments, the lid 302 and the base 304 can be comprised of the same, or substantially the same, materials. Additionally, the lid 302 can be long enough (e.g., along the "X" axis shown in FIG. 3) to rest on the plurality of side walls 308. A thickness (e.g., along the "Y" axis shown in FIG. 3) of the lid 302 can vary depending on the dimensions of the qubit chip enclosure 300 and/or qubit chip assembly 100. For instance, a thickness (e.g., along the "Y" axis shown in FIG. 3) of the lid 302 can range from, for example, greater than or equal to 1 mm and less than or equal to 2 cm.

As show in FIG. 3, in one or more embodiments the one or more electrical connectors 112 can be fixed within the lid 302. For example, the one or more electrical connectors 112 can fixed within one or more holes of the lid 302 such that the one or more electrical connectors 112 can extend through the lid 302. For instance, the pressure connection portion 114 of the one or more electrical connectors 112 can be located at a first side 310 of the lid 302, while the wire connection portion 116 of the one or more electrical connectors 112 can be located at a second side 312 of the lid 302. In one or more embodiments, one or more seals can be located between the one or more electrical connectors 112 and the lid 302.

Further, the lid 302 can comprise one or more pressing devices 314 that can extend from the first side 310 of the lid 302. The one or more pressing devices 314 can be a device that exerts a force along the "Y" axis shown in FIG. 3 when the lid 302 is secured to a base 304 that is housing a qubit chip assembly 100. For instance, the one or more pressing devices 314 can be one or more springs (e.g., as shown in FIG. 3). Example pressing devices 314 can include, but are not limited to: an elastic member (e.g., a rubber member), a spring, a lever, an extended ridge of the lid 302, a combination thereof, and/or the like. In one or more embodiments, the lid 302 can comprise a plurality of pressing devices 314 extending from the first side 310.

Figure 4A:
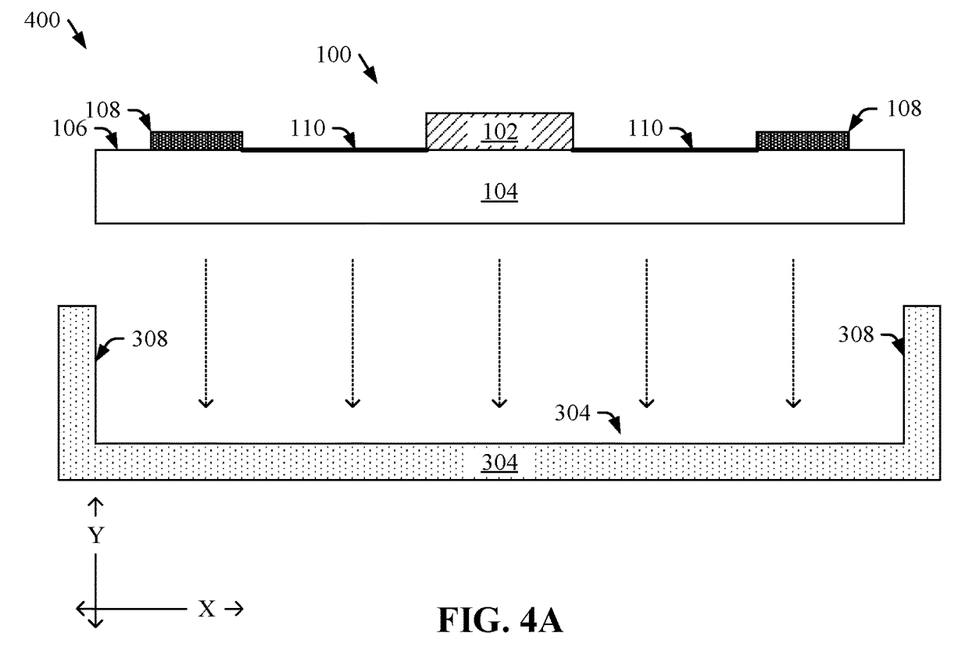
FIGS. 4A-4B illustrate diagrams of an example, non-limiting first stage of housing a qubit chip assembly within a qubit chip enclosure in accordance with one or more embodiments described herein.
Figure 4B:
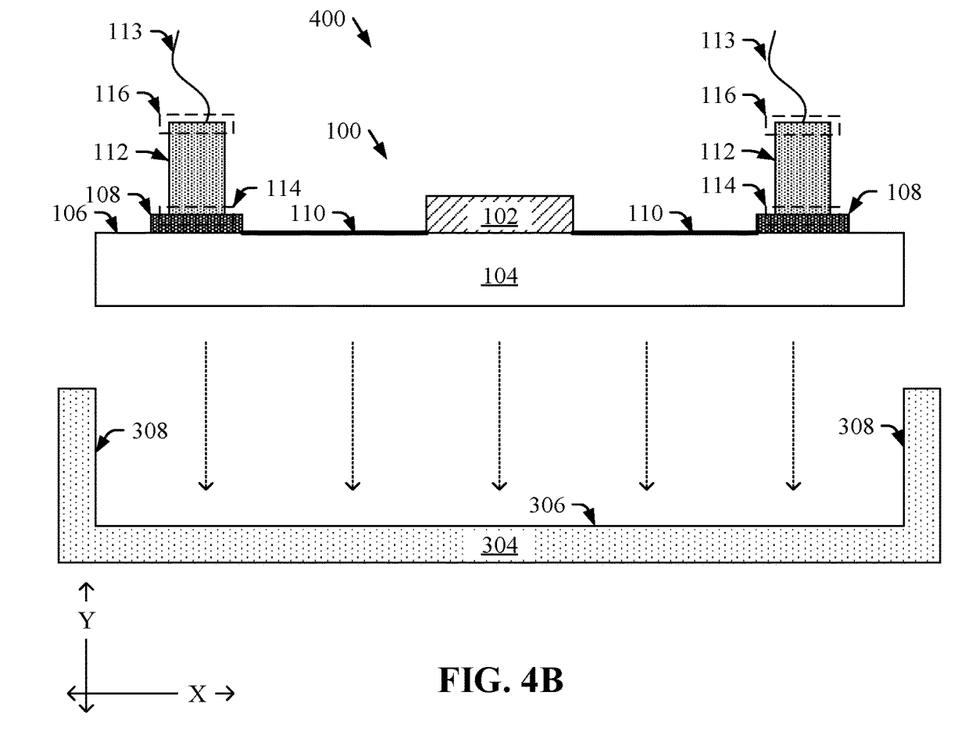

FIGS. 4A-4B illustrate diagrams of an example, non-limiting first stage 400 of housing the qubit chip assembly 100 within the qubit chip enclosure 300 in accordance with one or more embodiments described herein. Repetitive description of like elements employed in other embodiments described herein is omitted for the sake of brevity. At the first stage 400, the qubit chip assembly 100 can be positioned within the base 304 of the qubit chip enclosure 300. For example, the qubit chip assembly 100 can be positioned on the bottom wall 306 and between the plurality of side walls 308. For instance, the dotted arrows shown in FIGS. 4A-4B can denote inserting the qubit chip assembly 100 into the base 304 of the qubit chip enclosure 300.

FIG. 4A exemplifies an embodiment in which the qubit chip assembly 100 can be positioned within the base 304 without the one or more electrical connectors 112. For instance, the qubit chip assembly 100 can be inserted into the base 304 prior to coupling the one or more electrical connectors 112 to the contact pads 108. FIG. 4B exemplifies an embodiment in which the qubit chip assembly 100 can be positioned within the base 304 with the one or more electrical connectors 122 fixed to the interposer chip 104. For instance, the qubit chip assembly 100 can be inserted into the base 304 while being coupled to the one or more electrical connectors 112 via an interface with the one or more contact pads 108.

Figure 5A:
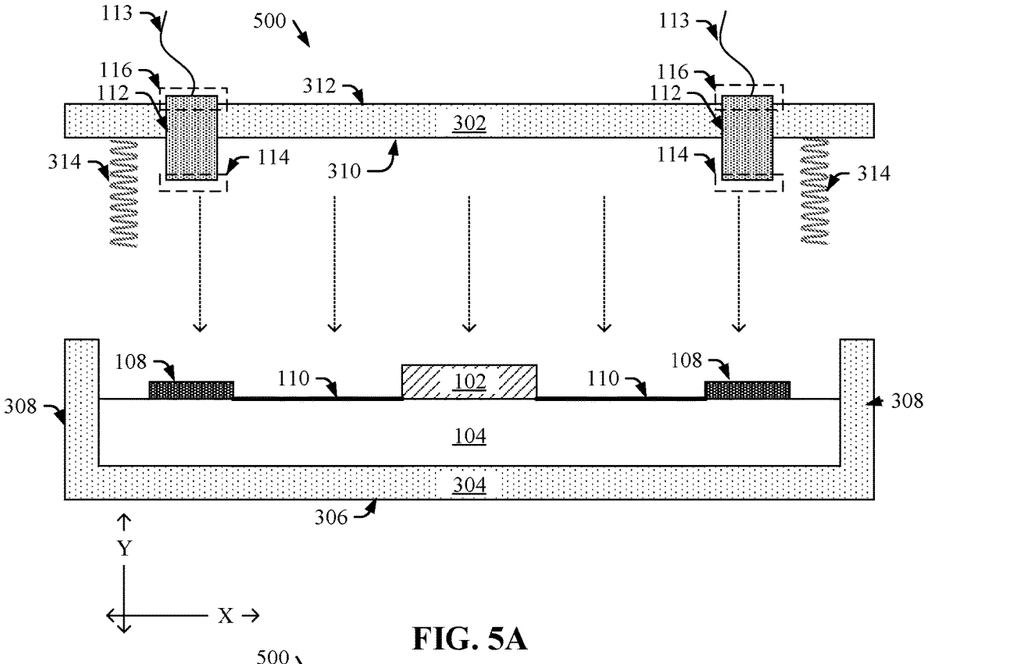
FIGS. 5A-5B illustrate diagrams of an example, non-limiting second stage of housing the qubit chip assembly comprising securing a lid to seal a qubit chip assembly within the qubit chip enclosure in accordance with one or more embodiments described herein.
Figure 5B:
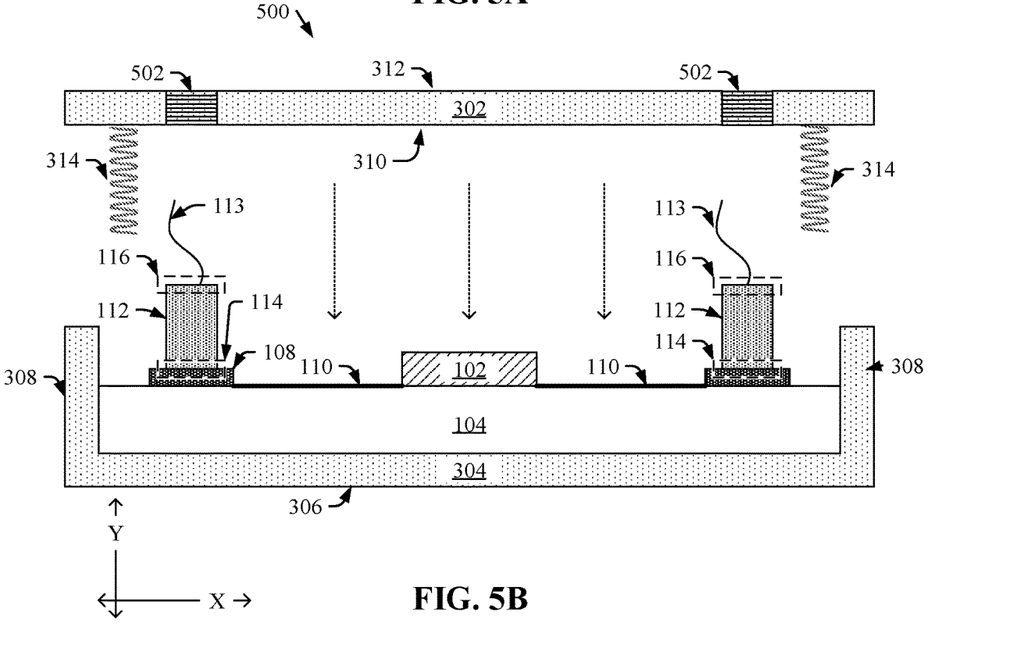

FIGS. 5A-5B illustrate diagrams of an example, non-limiting second stage 500 of housing the qubit chip assembly 100 within the qubit chip enclosure 300 in accordance with one or more embodiments described herein. Repetitive description of like elements employed in other embodiments described herein is omitted for the sake of brevity. At the second stage 500, the lid 302 of the qubit chip enclosure 300 can be positioned onto the base 304 to seal the qubit chip assembly 100 within the qubit chip enclosure 300. For instance, the dotted arrows shown in FIGS. 5A-5B can denote positioning the lid 302 onto the base 304. Thereby, the lid 302 can cover the qubit chip assembly 100.

FIG. 5A exemplifies the second stage 500 of housing the qubit chip assembly 100 presented in FIG. 4A. For example, the lid 302 can include the one or more electrical connectors 112, whereby positioning the lid 302 on the base 304 (e.g., on the plurality of side walls 308) can couple the one or more electrical connectors 112 with the one or more contact pads 108 via a pressure connection. FIG. 5B exemplifies the second stage 500 of housing the qubit chip assembly presented in FIG. 4B. for example, the lid 302 can include one or more holes 502 (e.g., delineated by cross-hatching in FIG. 5B), which can align with the one or more electrical connectors 112 directly coupled to the interposer chip 104 via the one or more contact pads 108. As the lid 302 is positioned onto the base 304 (e.g., in accordance with the direction denoted by the dotted arrows shown in FIG. 5B), the one or more electrical connectors 112 and/or wires 113 can pass through the aligned holes 502 in the lid 302.

Figure 6:
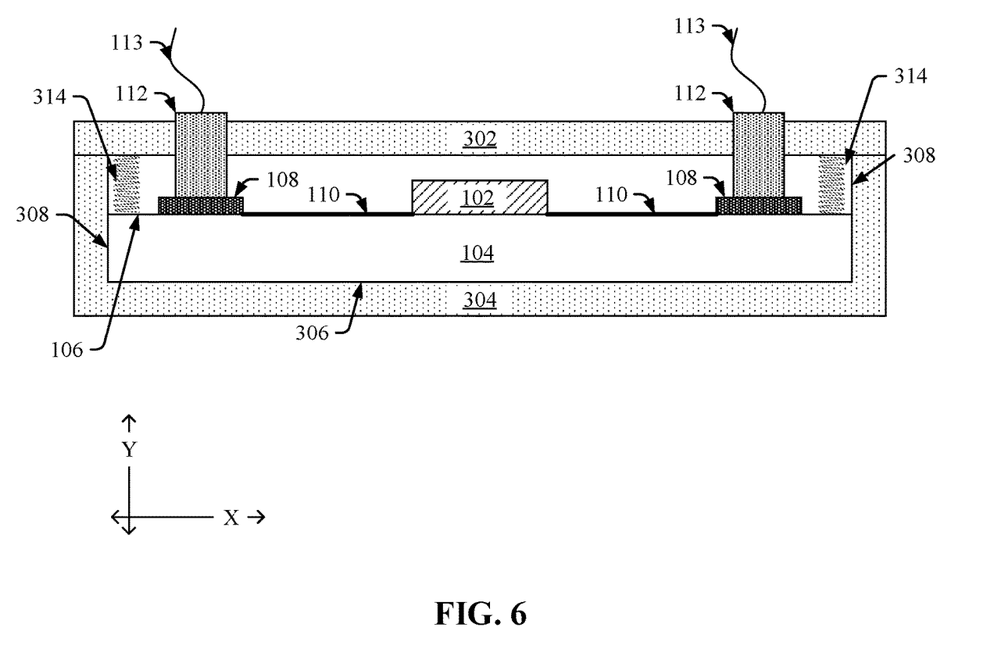
FIG. 6 illustrates a diagram of an example, non-limiting enclosed qubit chip assembly in which a qubit chip assembly can be housed inside an enclosure that facilitates a direct coupling of electrical connectors to an interposer chip of the qubit chip assembly in accordance with one or more embodiments described herein.

FIG. 6 illustrates a diagram of the example, non-limiting qubit chip assembly 100 housed within the qubit chip enclosure 300 in accordance with one or more embodiments described herein. Repetitive description of like elements employed in other embodiments described herein is omitted for the sake of brevity. For instance, the housed qubit chip assembly 100 can be achieved via the first stage 400 and/or second stage 500 of housing depicted in FIGS. 4A-5B. As exemplified in FIG. 6, the housed qubit chip assembly 100 can comprise the interposer chip 104 directly coupled to the one or more electrical connectors 112, which can extend through the qubit chip enclosure 300 (e.g., through the lid 302) to facilitate coupling to the one or more wires 513. FIG. 6 depicts the qubit chip assembly 100 abutting the side walls 308 of the base 304; however, the architecture of the qubit chip enclosure 300 is not so limited. For example, embodiments in which a space is present between the interposer chip 104 and the side walls 308 are also envisaged.

As shown in FIG. 6, positioning the lid 302 onto the base 304 of the qubit chip enclosure 300 can engage the one or more pressing devices 314 with the first surface 106 of the interposer chip 104. For instance, the one or more pressing devices 314 can be aligned with one or more portions of the interposer chip 104 located within distance D1. Additionally, or alternatively, one or more pressing devices 314 can align with other positions of the interposer chip 104, such as positions between the one or more contact pads 108 and the one or more qubit chips 102. While the lid 302 is positioned on the base 304, the one or more pressing devices 314 can exert a force on the interposer chip 104 that presses the interposer chip 104 against the bottom wall 306 of the base 304. For example, FIG. 6 depicts an exemplary embodiment in which the one or more pressing devices 314 are springs, which are in a compressed state when the lid 302 is positioned on the base 304.

In various embodiments, the force exerted by the one or more pressing devices 314 can facilitate fixing the qubit chip assembly 100 in a desired position within the qubit chip enclosure 300. Further, the force exerted by the one or more pressing devices 314 can establish contact between the surface area of the interposer chip 104 and the surface area of the bottom wall 306 that can facilitate thermal conductance. For instance, the housed qubit chip assembly 100 (e.g., as shown in FIG. 6) can be positioned within the dilution refrigerator of a quantum computer. The qubit chip assembly 100 can experience the cooling established by the refrigerator via the thermal contact between the interposer chip 104 and the base 304.

Figure 7:
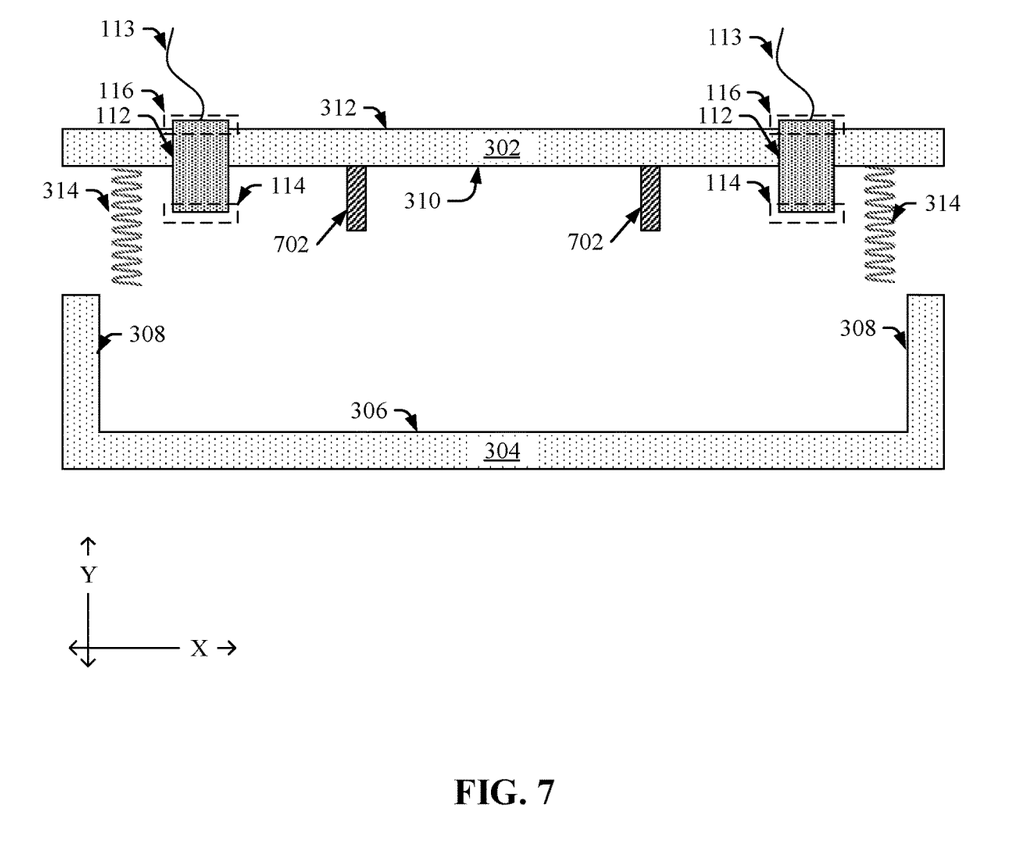
FIG. 7 illustrates a diagram of an example, non-limiting enclosure comprising one or more isolation barriers that can surround one or more qubit chip assemblies in accordance with one or more embodiments described herein.

FIG. 7 illustrates a diagram of the example, non-limiting qubit chip enclosure 300 further comprising one or more isolation barriers 702 in accordance with one or more embodiments described herein. Repetitive description of like elements employed in other embodiments described herein is omitted for the sake of brevity. In various embodiments, the lid 302 can comprise one or more isolation barriers 702 from the first side 310. For instance, as the lid 302 is positioned onto the base 304, the one or more isolation barriers 702 can extend from the first side 310 of the lid 302 towards the base 304. In one or more embodiments, the one or more isolation barriers 702 can comprise one or more materials that can inhibit migration of electromagnetic fields. Example materials that can be comprised within the one or more isolation barriers 702 can include, but are not limited to: tungsten, copper, sapphire, quartz, boron nitride, a combination thereof, and/or the like. Further, the one or more isolation barriers 702 can comprise one or more materials that can form a microwave seal between the lid 302 and the interposer chip 104, including, but not limited to: indium, indium alloys, tin alloys, lead alloys, a combination thereof, and/or the like. In one or more embodiments, the one or more isolation barriers 702 can comprise (e.g., located at a distal end) one or more compressible microwave gaskets (e.g., comprised of copper mesh, which can be plated with various metals such as: gold, molybdenum, a combination thereof, and/or the like). In one or more embodiments, the one or more isolation barriers 702 can be formed integrally with the lid 302.

In various embodiments, positioning the lid 302 onto the base 304 during the first stage 400 of housing the qubit chip assembly 100 can position the one or more isolation barriers 702 onto the first surface 106 of the interposer chip 104. For example, the height (e.g., along the "Y" axis shown in FIG. 7) of the one or more isolation barriers 702 can depend on the thickness (e.g., along the "Y" axis shown in FIG. 7) of the interposer chip 104 and/or the height (e.g., along the "Y" axis shown in FIG. 7) of the plurality of side walls 308. Additionally, the thickness (e.g., along the "X" axis shown in FIG. 7) of the one or more isolation barriers 702 can depend on the architecture and/or operation of the one or more qubit chips 102. For instance, the thickness (e.g., along the "X" axis shown in FIG. 7) of the one or more isolation barriers 702 can range from, for example, greater than or equal to 1 mm and less than or equal to 1 cm.

Figure 8:
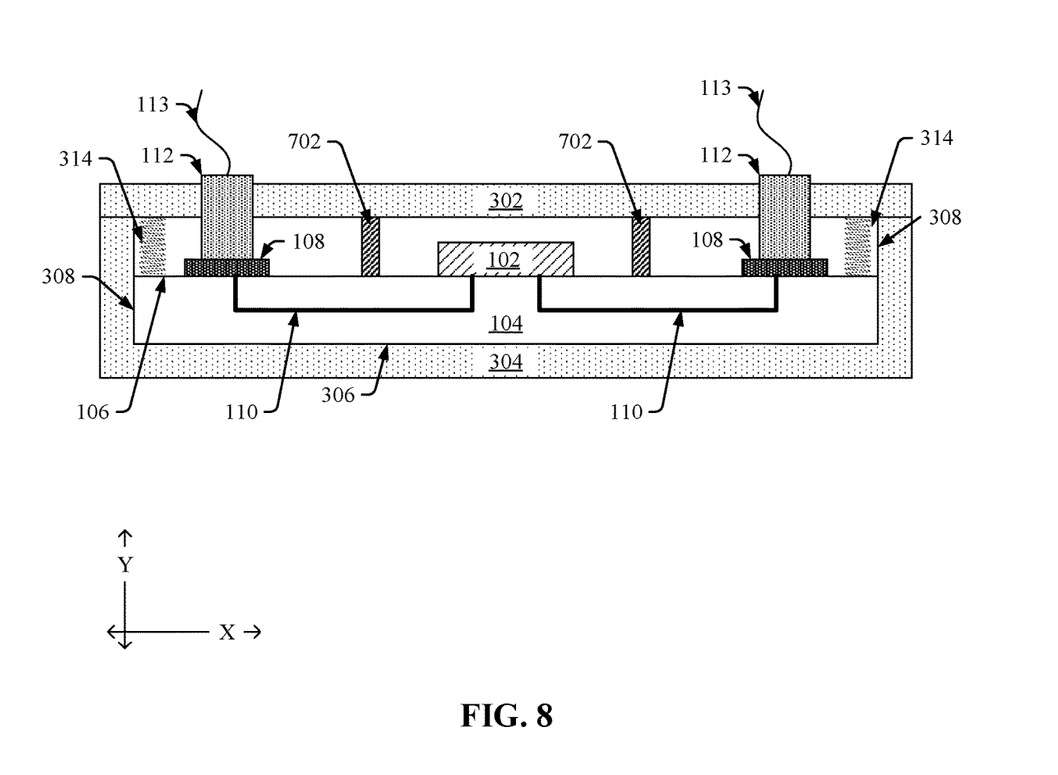
FIG. 8 illustrates a diagram of an example, non-limiting enclosed qubit chip assembly in which a qubit chip assembly can be housed inside an enclosure that facilitates a direct coupling of electrical connectors to an interposer chip and an isolation of a qubit chip in accordance with one or more embodiments described herein.

FIG. 8 illustrates a diagram of the example, non-limiting qubit chip assembly 100 housed within a qubit chip enclosure 300 that comprises the one or more isolation barriers 702 in accordance with one or more embodiments described herein. Repetitive description of like elements employed in other embodiments described herein is omitted for the sake of brevity. As show in FIG. 8, while the lid 302 is positioned on the base 304, the one or more isolation barriers 702 can extend between the lid 302 and the interposer chip 104 at one or more positions adjacent to the one or more qubit chips 102. For example, the one or more isolation barriers 702 can forma a seal around the one or more qubit chips 102; thereby isolating the one or more qubit chips 102 from other areas within the qubit chip enclosure 300. Further, the one or more isolation barriers 702 can serve to shield the one or more qubit chips 102 from electromagnetic radiation. For example, the one or more isolation barriers 702 can block the migration of one or more electromagnetic fields from interacting with the one or more qubit chips 102.

FIG. 8 depicts the one or more isolation barriers 702 adjacent to the left and right sides of the one or more qubit chips 102 for clarity purposes; however, the architecture of the qubit chip enclosure 300 is not so limited. For example, embodiments in which the one or more isolation barriers 702 further extend along the "X" axis shown in FIG. 8 are also envisaged. For instance, the one or more isolation barriers 702 can surround the one or more qubit chips 102 on the interposer chip 104. Where multiple qubit chips 102 are positioned on the interposer chip 104, the one or more isolation barriers 702 can be arranged on the lid 302 so as to align with positions on the interposer chip 104 between respective qubit chips 102. For instance, each qubit chip 102 can be surrounded by isolation barriers 702 to individually isolate each qubit chip 102. In another instance, groups of qubit chips 102 can be surrounded by isolation barriers 702 to respectively isolate groups of qubit chips 102.

Further, as show in FIG. 8, the one or more isolation barriers 702 can be employed with qubit chip assembly 100 structures comprising embedded transmission lines 110. As such, the one or more isolation barriers 702 can avoid interference with the electrical coupling of the one or more qubit chips 102.

Figure 9A:
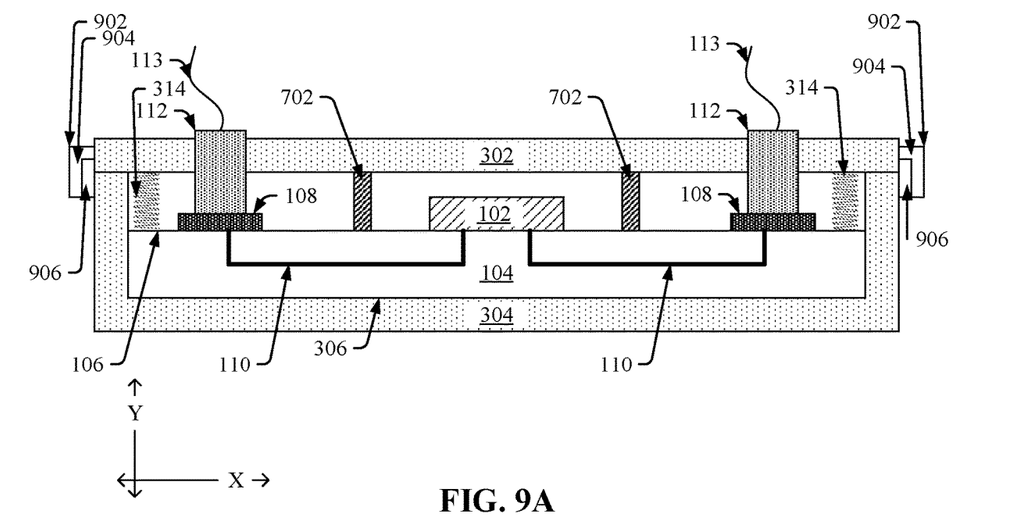
FIGS. 9A-9B illustrate diagrams of an example, non-limiting enclosed qubit chip assembly in which an enclosure lid can be secured to an enclosure base via various fixing means to seal one or more qubit chip assemblies in accordance with one or more embodiments described herein.
Figure 9B:
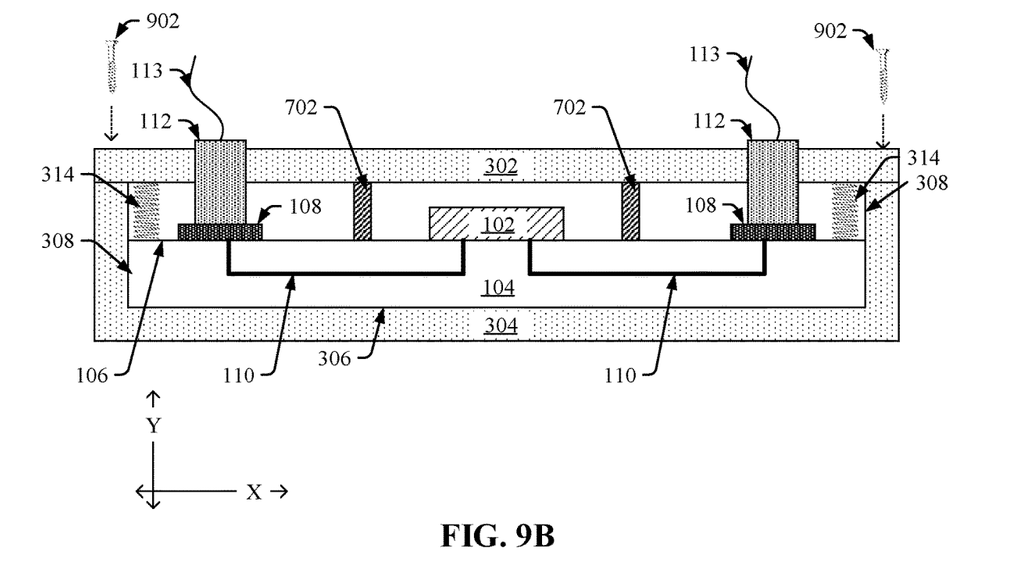

FIGS. 9A-9B illustrate diagrams of example, non-limiting fixing devices 902 that can be employed to fix the lid 302 of the qubit chip enclosure 300 to the base 304 in accordance with one or more embodiments described herein. Repetitive description of like elements employed in other embodiments described herein is omitted for the sake of brevity. In one or more embodiments, one or more fixing devices 902 can secure the lid 302 to the base 304 such to facilitate engagement of the one or more pressing devices 314. Example fixing devices 902 can include, but are not limited to: adhesives, tapes, screws, nails, staples, latches, hinges, switches, clasps, a combination thereof, and/or the like. In various embodiments, the one or more fixing devices 902 can attach to the lid 302 and one or more of the side walls 308. For example, the one or more fixing devices 902 can counteract one or more forces generated by the pressing devices 314 against the interposer chip 104 so that the lid 302 remains positioned on the side walls 208 of the base 304.

Additionally, in one or more embodiments the one or more fixing devices 902 can facilitate, and/or maintain, the contact between the one or more electrical connectors 112 and the one or more contact pads 108. For example, where the one or more electrical connectors 112 are secured to the lid 302; securing the lid 302 to the side walls 308 can also secure the position of the one or more electrical connectors 112 on the one or more contact pads 108. In another example, securing the lid 302 to the side walls 308 can inhibit one or more lateral forces that can push the one or more electrical connectors 112 out of alignment with the one or more contact pads 108.

FIG. 9A exemplifies an embodiment in which the one or more fixing devices 902 can be attached to the outside of the qubit chip enclosure 300 between the lid 302 and the base 304. For instance, the one or more fixing devices 902 can be one or more latch and/or clasp mechanisms, with a first portion of the fixing devices 902 located on the lid 302 and another portion of the fixing devices 902 located one or more of the side walls 308. When the lid 302 is positioned onto the side walls 308 the first portion of the fixing devices 902 can engage with the second portion of the fixing devices 902 to secure the lid 302 on the base 304 and seal the qubit chip assembly 100 within the qubit chip enclosure 300 while still facilitating a coupling to the wires 113. FIG. 9B exemplifies an embodiment in which the one or more fixing devices 902 are screws that can be screwed through the lid 302 and into the side walls 308. For example, the one or more screws can be drilled into the lid 302 in accordance with the dotted arrows denoted in FIG. 9B.

Figure 10:
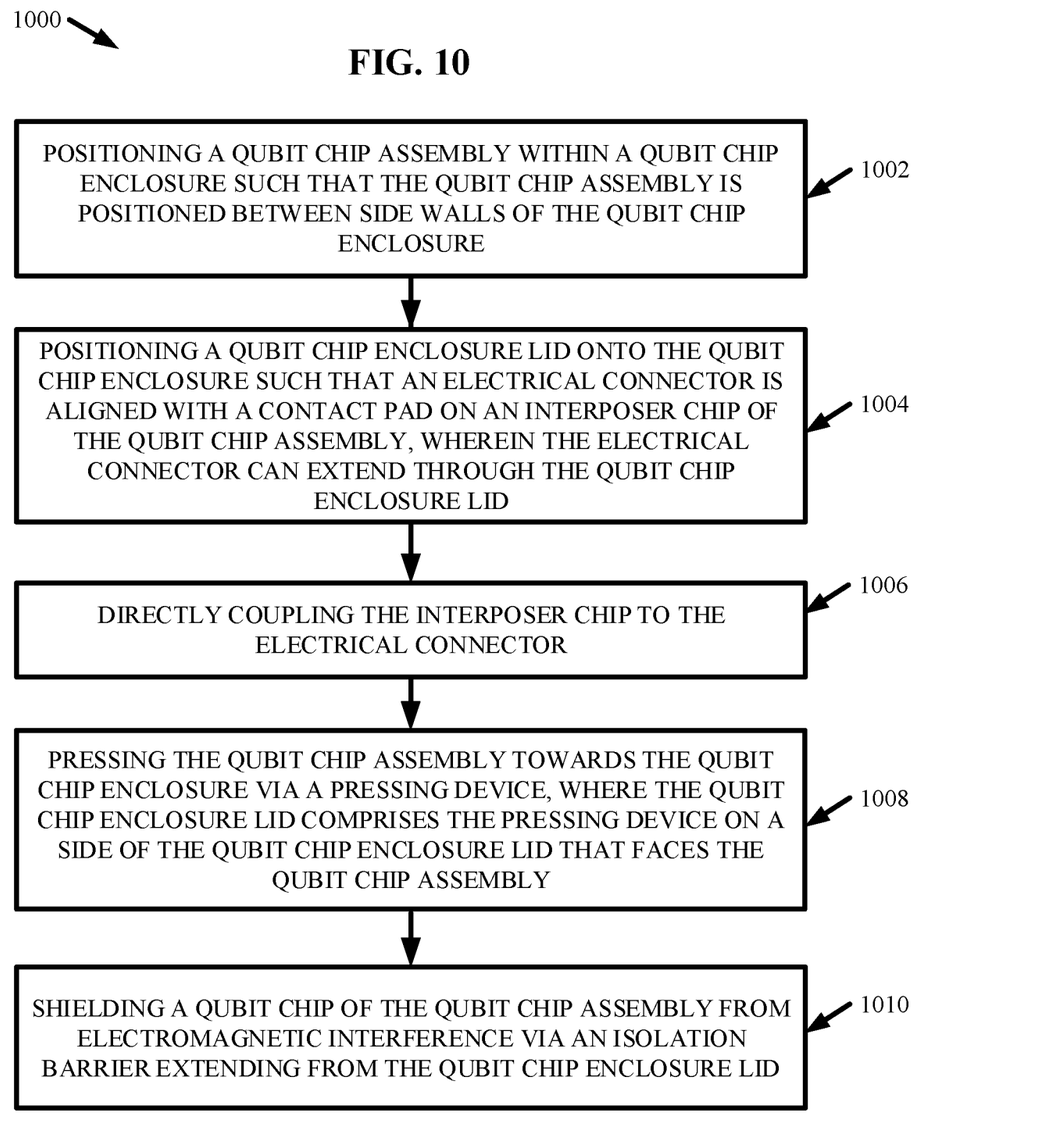
FIG. 10 illustrates a flow diagram of an example, non-limiting method for housing a qubit chip assembly in one or more enclosures in accordance with one or more embodiments described herein.

FIG. 10 illustrates a flow diagram of an example, non-limiting method 1000 that can facilitate housing one or more qubit chip assemblies 100 within one or more qubit chip enclosures 300 in accordance with one or more embodiments described herein. Repetitive description of like elements employed in other embodiments described herein is omitted for the sake of brevity.

At 1002, the method 1000 can comprise positioning a qubit chip assembly 100 within a qubit chip enclosure 300 such that the qubit chip assembly 100 can be positioned between side walls 308 of the qubit chip enclosure 300. For example, the qubit chip assembly 100 can be positioned within the qubit chip enclosure 300 in accordance with the first stage 400 of housing the qubit chip assembly 100 exemplified in FIGS. 4A-4B.

At 1004, the method 1000 can comprise positioning a qubit chip enclosure lid (e.g., lid 302) onto the qubit chip enclosure 300 (e.g., onto base 304) such that one or more electrical connectors 112 can be aligned with one or more contact pads 108 located on an interposer chip 104 of the qubit chip assembly 100. Further, the one or more electrical connectors 112 can extend through the qubit chip enclosure lid (e.g., lid 302). For example, the qubit chip enclosure lid (e.g., lid 302) can be positioned on the qubit chip enclosure 300 in accordance with the second stage 500 of housing the qubit chip assembly 100 exemplified in FIG. 5A.

At 1006, the method 1000 can comprise directly coupling the interposer chip 104 to the one or more electrical connectors 112. For example, the qubit chip enclosure lid (e.g., lid 302) can be secured to the one or more side walls 308 to bring the one or more electrical connectors 112 into contact with the one or more contact pads 108 and establish the coupling at 1006. At 1008, the method 1000 can comprise pressing the qubit chip assembly 100 towards the qubit chip enclosure 300 via one or more pressing devices 314. The qubit chip enclosure lid (e.g., lid 302) can comprise the one or more pressing devices 314 on a side of the qubit chip enclosure lid that faces the qubit chip assembly 100 (e.g., on the first side 310 of lid 302). At 1010, the method 1000 can comprise shielding one or more qubit chips 102 of the qubit chip assembly 100 from electromagnetic interference via one or more isolation barriers 702 that can extend from the qubit chip enclosure lid (e.g., lid 302).

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a qubit chip positioned on an interposer chip;
an electrical connector in direct contact with the interposer chip, wherein the electrical connector establishes an electrical communication between a wire and a contact pad of the interposer chip that is coupled to the qubit chip;
an enclosure lid positioned adjacent to the qubit chip and the interposer chip, wherein the electrical connector extends through the enclosure lid; and
an isolation barrier extending from the enclosure lid to the interposer chip, wherein the isolation barrier at least partially surrounds the qubit chip.

2. The apparatus of claim 1, wherein the electrical connector is removably connected with the contact pad positioned on the interposer chip.

3. The apparatus of claim 1, wherein the interposer chip comprises a superconducting transmission line coupling the qubit chip to the contact pad.

4. The apparatus of claim 1, wherein the electrical connector and the interposer chip are in contact with each other via a solderless pressure connection.

5. The apparatus of claim 1, further comprising:
an enclosure base positioned adjacent to the interposer chip and opposite the enclosure lid, wherein the enclosure base supports the interposer chip.

6. The apparatus of claim 5, wherein the enclosure lid further comprises a pressing device in contact with the interposer chip, wherein the pressing device presses the interposer chip towards the enclosure base.

7. The apparatus of claim 1, wherein the enclosure lid comprises at least one rigid material selected from a group consisting of tungsten, copper, sapphire, quartz, and boron nitride.

8. An apparatus comprising:
a qubit chip enclosure lid;
an electrical connector that extends through the qubit chip enclosure lid, wherein the electrical connector has a pressure connection portion and a wire connection portion positioned at opposite ends of the electrical connector; and
a qubit chip enclosure that comprises a base and a plurality of side walls, wherein the plurality of side walls extend from the base and support the qubit chip enclosure lid.

9. The apparatus of claim 8, wherein the qubit chip enclosure lid comprises at least one rigid material selected from a group consisting of tungsten, copper, sapphire, quartz, and boron nitride.

10. The apparatus of claim 8, wherein the pressure connection portion is at a first side of the qubit chip enclosure lid, and wherein the wire connection portion is at a second side of the qubit chip enclosure lid.

11. The apparatus of claim 10, wherein the qubit chip enclosure lid further comprises a pressing device positioned on the first side of the qubit chip enclosure lid.

12. The apparatus of claim 8, wherein the qubit chip enclosure lid further comprises an isolation barrier that blocks electromagnetic radiation.

13. The apparatus of claim 8, further comprising:
a qubit chip assembly positioned adjacent to the qubit chip enclosure lid, wherein the qubit chip assembly comprises an interposer chip directly coupled to the electrical connector via the pressure connection portion.

14. A method comprising:
positioning a qubit chip assembly within a qubit chip enclosure such that the qubit chip assembly is positioned between side walls of the qubit chip enclosure; and
directly coupling an interposer chip of the qubit chip assembly to an electrical connector, wherein the electrical connector extends through a qubit chip enclosure lid, and wherein the interposer chip is further coupled to a qubit chip.

15. The method of claim 14, further comprising:
positioning the qubit chip enclosure lid onto the qubit chip enclosure such that the electrical connector is aligned with a contact pad on the interposer chip.

16. The method of claim 15, further comprising:
pressing the qubit chip assembly towards the qubit chip enclosure via a pressing device, wherein the qubit chip enclosure lid comprises the pressing device on a side of the qubit chip enclosure lid that faces the qubit chip assembly.

17. The method of claim 16, further comprising:
shielding the qubit chip of the qubit chip assembly from electromagnetic interference via an isolation barrier that extends from the qubit chip enclosure lid.

18. The method of claim 17, wherein the isolation barrier comprises a microwave gasket.

19. The method of claim 16, wherein the directly coupling the interposer chip to the electrical connector employs a removable coupling mechanism.

20. The method of claim 16, wherein the qubit chip enclosure lid comprises at least one rigid material selected from a group consisting of tungsten, copper, sapphire, quartz, and boron nitride.

* * * * *